(12) United States Patent
Hur et al.

(10) Patent No.: US 8,273,211 B2
(45) Date of Patent: Sep. 25, 2012

(54) FLAT PANEL DISPLAY MANUFACTURING APPARATUS

(75) Inventors: Gwang Ho Hur, Yongin-shi (KR); Jun Young Choi, Seoul (KR); Cheol Won Lee, Anyang-shi (KR); Hyun Hwan Ahn, Sungnam-shi (KR); Young Joo Hwang, Seoul (KR); Chun Sik Kim, Sungnam-shi (KR)

(73) Assignee: Advanced Display Process Engineering Co., Ltd. (KR)

( * ) Notice: Subject to any disclaimer, the term of this patent is extended or adjusted under 35 U.S.C. 154(b) by 0 days.

(21) Appl. No.: 12/246,563

(22) Filed: Oct. 7, 2008

(65) Prior Publication Data

US 2009/0025877 A1    Jan. 29, 2009

Related U.S. Application Data

(63) Continuation of application No. 10/983,832, filed on Nov. 8, 2004, now abandoned.

(30) Foreign Application Priority Data

Nov. 14, 2003 (KR) .................. 2003-80406
Nov. 14, 2003 (KR) .................. 2003-80412
Dec. 9, 2003 (KR) .................. 2003-89112

(51) Int. Cl.
*H01L 21/3065* (2006.01)
(52) U.S. Cl. ........... 156/345.48; 156/345.3; 156/345.43; 313/620; 118/715
(58) Field of Classification Search .................. 118/715; 156/345.3, 345.43, 345.48; 313/620
See application file for complete search history.

(56) References Cited

U.S. PATENT DOCUMENTS

| | | | |
|---|---|---|---|
| 5,441,615 A | 8/1995 | Mukai et al. | 204/192.12 |
| 5,458,689 A | 10/1995 | Saito | |
| 6,036,782 A | 3/2000 | Tanaka et al. | |
| 6,261,408 B1 | 7/2001 | Schneider et al. | 156/345.26 |
| 6,433,484 B1 * | 8/2002 | Hao et al. | 315/111.21 |
| 6,451,703 B1 | 9/2002 | Liu et al. | 438/710 |
| 6,527,911 B1 | 3/2003 | Yen et al. | 156/345.43 |
| 6,759,338 B2 | 7/2004 | Ohmoto et al. | |
| 6,796,269 B2 | 9/2004 | Sasaki et al. | |
| 7,083,702 B2 | 8/2006 | Blonigan et al. | |
| 7,147,793 B2 | 12/2006 | Fink | |
| 7,182,816 B2 | 2/2007 | Kleshock et al. | |
| 2002/0088545 A1 | 7/2002 | Lee et al. | |
| 2002/0118973 A1 | 8/2002 | Ueda et al. | |

(Continued)

FOREIGN PATENT DOCUMENTS

JP  10-265977  6/1998
JP  2005-264250  9/2005

*Primary Examiner* — Ram Kackar
*Assistant Examiner* — Satish Chandra
(74) *Attorney, Agent, or Firm* — Locke Lord LLP; Alan M. Sack, Esq.

(57) ABSTRACT

Disclosed herein is a flat panel display manufacturing apparatus in a predetermined process is performed using plasma generated therein. In such a flat panel display manufacturing apparatus, a process gas is supplied into a chamber in an evenly diffused state to generate even plasma inside a symmetrical interior space of the chamber. Consequently, the flat panel display manufacturing apparatus can appropriately control flow rate of the plasma, thereby being capable of performing even processing on a large-scale substrate. In the flat panel display manufacturing apparatus, a substrate pedestal thereof is provided with a combination of vertical and horizontal shielding members, thereby being entirely protected from attack of the plasma, resulting in an increased life-span.

3 Claims, 10 Drawing Sheets

U.S. PATENT DOCUMENTS

| | | |
|---|---|---|
| 2003/0164929 A1 | 9/2003 | Tanimoto |
| 2003/0207033 A1 | 11/2003 | Yim et al. |
| 2004/0035364 A1 | 2/2004 | Tomoyoshi et al. |
| 2005/0133161 A1 | 6/2005 | Carpenter et al. |
| 2006/0151114 A1 | 7/2006 | Fink ................. 156/345.29 |
| 2007/0000614 A1 | 1/2007 | Hatamura et al. |

* cited by examiner

Added Reference Character → 11

FLAT PANEL DISPLAY MANUFACTURING APPARATUS

CROSS-REFERENCE TO RELATED APPLICATIONS

This application is a continuation of, and claims priority to, U.S. patent application Ser. No. 10/983,832, filed Nov. 8, 2004 now abandoned, to which priority under 35 U.S.C. §120 is claimed. This application claims a benefit of priority based on Korea Patent Application Nos. 2003-80406 and 2003-80412, filed Nov. 14, 2003 and 2003-89112 filed Dec. 9, 2003 which are hereby incorporated by reference herein in their entirety as if fully set forth herein.

FIELD OF THE INVENTION

The present invention relates to a flat panel display manufacturing apparatus which is capable of performing a predetermined process on a substrate under vacuum using plasma generated in the chamber.

BACKGROUND OF THE INVENTION

Description of the Related Art

In general, flat panel display manufacturing apparatuses are classified into wet-etching apparatuses using wet-chemical, and dry-etching apparatuses using inert gas.

In such a dry-etching apparatus, a specific reactive gas is introduced into a strong electric field produced between two substrate pedestals, so that it is changed into an ionized plasma gas while being taken away electrons by the electric field. Here, the ionized plasma gas shows high reactivity in a neutral state. After that, using a byproduct produced as the plasma gas reacts with exposed regions of an oxide film not covered by a photoresist mask, the dry-etching apparatus performs a predetermined process, such as etching.

The reactive gas, for use in the operation of the dry-etching apparatus, is introduced into a chamber of the dry-etching apparatus, so as to be used in a predetermined reaction, by passing through a shower head installed in an upper portion of the chamber. After reaction completion, the reactive gas is discharged to the outside via a pumping port formed at one side of the chamber.

Figure 1:
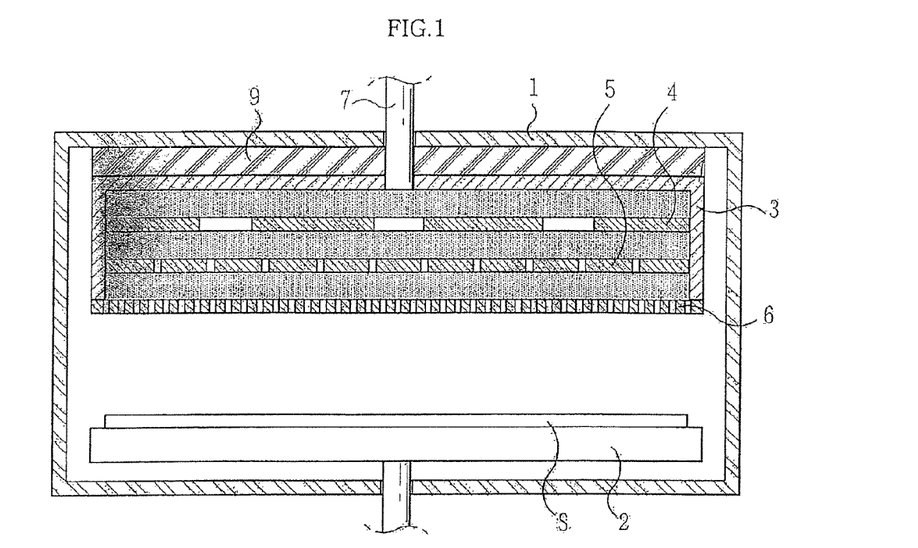
FIG. 1 is a sectional view illustrating the structure of a conventional flat panel display manufacturing apparatus.

FIG. 1 is a sectional view illustrating the structure of a conventional flat panel display manufacturing apparatus. As shown in FIG. 1, the shower head, provided in the conventional dry-etching type apparatus, has a complicated structure wherein a plurality of diffusion plates 4 and 5 are mounted, resulting in an increase in manufacturing costs of the dry-etching apparatus.

The shower head further comprises a spray plate 6 installed at an open lower surface of a shower head body 3. Typically, the spray plate 6 is formed with hundreds to thousands of spray holes, and the diameter of the spray holes is excessively small, less than 1 mm, complicating processing of the spray holes.

The shower head body 3 and the spray plate 6 are usually made of aluminum, and are externally anodized. In this case, if a specific region of the anodized aluminum is damaged by plasma and exposed to the outside, electric current is instantaneously concentrated on the exposed aluminum of the shower head body and the spray plate, causing an arcing phenomenon. Here, the shower head serves as an upper substrate pedestal. Once the arcing phenomenon occurs, partial particles of the anodized aluminum are separated and act as contaminants.

Such an arcing phenomenon, specifically, frequently occurs around the spray holes of the spray plate 6, causing damage to the spray holes and resulting in the necessity of periodic exchange of the spray plate 6. However, due to the high price and difficult manufacturing process thereof, frequent exchange of the spray plate 6 disadvantageously increases the price of substrates being produced.

Recently in the flat panel display manufacturing industry, large-scale substrates have been processed by the flat panel display manufacturing apparatus with the result that the surface area of the spray plate 6 as well as the flat panel display manufacturing apparatus itself is on the increase. The spray plate having such an increased surface area, however, suffers from warping at the center region thereof, complicating even diffusion of a process gas.

Meanwhile, the chamber of the flat panel display manufacturing apparatus has a substrate entrance/exit opening formed to communicate with the outside, and a gate is provided external to the substrate entrance/exit opening to open or close it. In this case, an inner wall surface of the chamber defined by the substrate entrance/exit opening recedes from the substrate pedestals as compared to the remaining wall surface of the chamber. This provides the chamber with an asymmetrical interior space about the substrate pedestals and generates uneven plasma flow inside the chamber, resulting in uneven processing of substrates.

SUMMARY OF THE INVENTION

Therefore, the present invention has been made in view of the above problems, and it is an object of the present invention to provide a flat panel display manufacturing apparatus having a shower head, which has a simplified structure and is easy to manufacture.

It is another object of the present invention to provide a flat panel display manufacturing apparatus having a shower head which can eliminate generation of an arcing phenomenon around spray holes during etching.

It is still another object of the present invention to provide a flat panel display manufacturing apparatus having a shower head which can prevent warping at the center region of a spray plate thereof.

It is still another object of the present invention to provide a flat panel display manufacturing apparatus having a chamber which defines a symmetrical interior space in order to prevent a substrate from being unevenly processed due to spatial asymmetry.

It is still another object of the present invention to provide a flat panel display manufacturing apparatus having baffles, which can maintain constant flow rate of plasma regardless of exhaust units, thereby enabling even processing of a substrate.

It is yet another object of the present invention to provide a flat panel display manufacturing apparatus having a plasma shielding device, which can effectively protect a substrate pedestal from plasma.

In accordance with the present invention, the above and other objects can be accomplished by the provision of a flat panel display manufacturing apparatus comprising: a chamber under vacuum, a substrate pedestal located in a lower portion of the chamber, on the substrate pedestal being disposed a substrate so that a predetermined process is performed on the substrate using plasma generated in the chamber, and a shower head, wherein the shower head comprises:

a shower head body located in an upper portion of the chamber, the shower head body having a hollow structure opened at a lower surface thereof; a diffusion plate horizontally mounted in the shower head body and having a plurality of diffusion holes formed through predetermined positions; a spray plate spaced apart from the diffusion plate by an even predetermined height so as to be mounted at the open lower surface of the shower head body, the spray plate having a plurality of spray holes formed through predetermined positions; and spray plate supporting members connected at their lower ends to the spray plate and connected at their upper ends to a top wall surface of the shower head body for supporting and fixing the spray plate relative to the shower head body.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the accompanying drawings. From the following description, the present invention will be more clearly understood.

Embodiment 1

Figure 2:
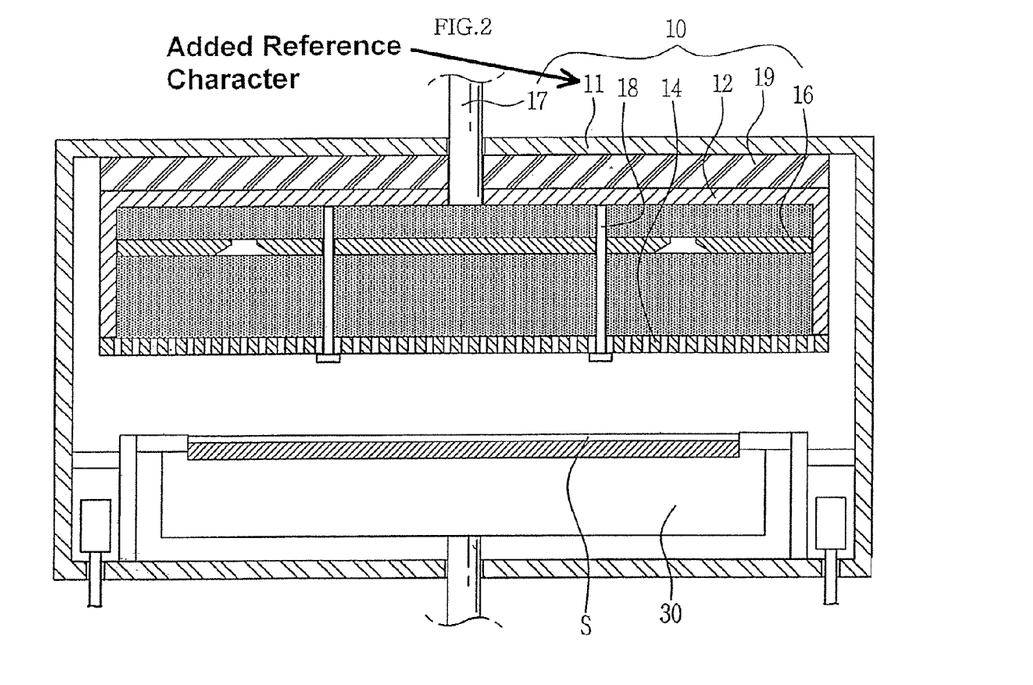
FIG. 2 is a sectional view illustrating the structure of a flat panel display manufacturing apparatus in accordance with the present invention.

FIG. 2 is a sectional view illustrating the structure of a flat panel display manufacturing apparatus in accordance with the present invention. As shown in FIG. 2, the flat panel display manufacturing apparatus comprises a shower head 10, and in turn, the shower head 10 comprises: a chamber 11, a shower head body 12, a diffusion plate 16, a spray plate 14, and spray plate supporting members 18.

The shower head body 12 of the shower head 10 is positioned in an upper portion of a chamber of the flat panel display manufacturing apparatus, and defines an interior space having a predetermined volume. The shower head body 12 is open at a lower surface thereof, and is fixedly attached at an upper surface thereof to a top wall surface of the chamber. At a predetermined position of the upper surface of the shower head body 12 is formed a process gas inlet channel 17 for introducing a process gas into the shower head body 12. An outer end of the process gas inlet channel 17 is coupled to an RF current supply device (not shown). Such a shower head body 12 is preferably made of an electrically conductive material.

As shown in FIG. 2, the diffusion plate 16 is mounted in the shower head body 12, specifically, in an upper portion of the shower head body 12, so that it is spaced apart from a top surface of the shower head body 12 by a predetermined distance. With such a configuration, the process gas is introduced via the process gas inlet channel 17 and is primarily diffused in a space defined by the predetermined distance, and then is secondarily diffused while passing through diffusion holes 16a of the diffusion plate 16.

Figure 3:
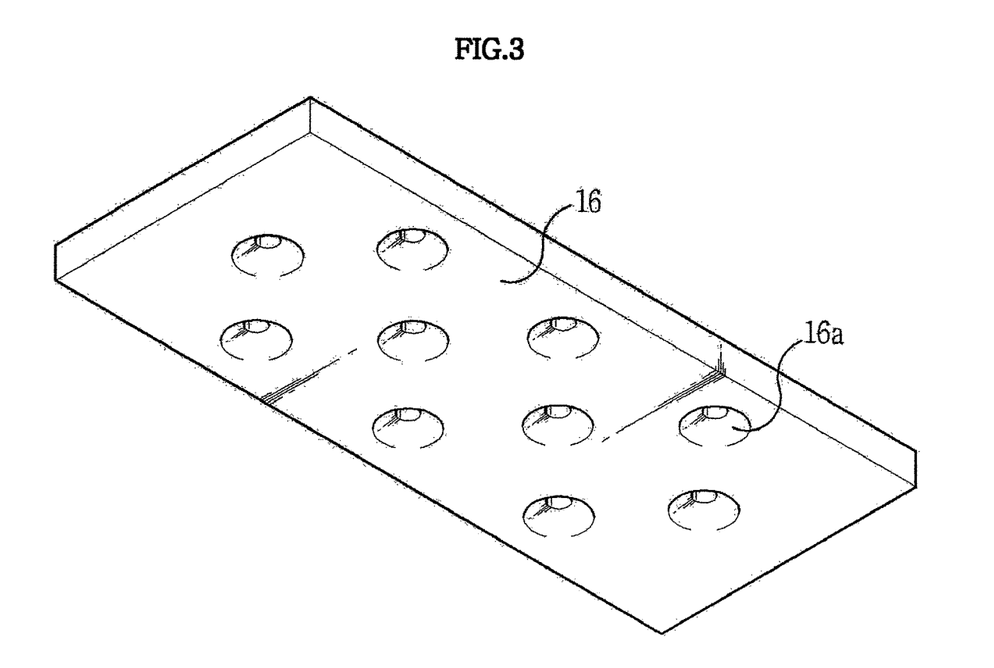
FIG. 3 is a perspective view illustrating the structure of a diffusion plate mounted in a shower head in accordance with the present invention.

Referring to FIG. 3 illustrating the structure of the diffusion plate 16, a plurality of the diffusion holes 16a perforated through the diffusion plate 16, preferably, are uniformly distributed throughout the overall surface of the diffusion plate 16. This enables even diffusion of the process gas.

Figure 4:
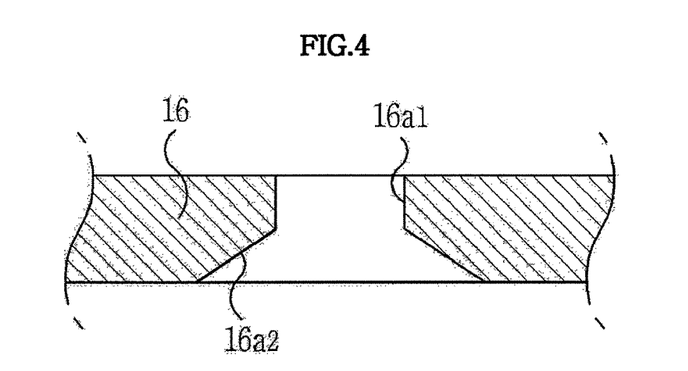
FIG. 4 is a sectional view illustrating the structure of a diffusion hole perforated through the diffusion plate shown in FIG. 3.

FIG. 4 is a sectional view illustrating the structure of the diffusion hole 16a formed at the diffusion plate 16 shown in FIG. 3. As shown in FIG. 4, the diffusion hole 16a is perforated through the overall thickness of the diffusion plate 16. Such a diffusion hole 16a is divided into a narrow cylindrical upper portion 16a1, and a conical lower portion 16a2 having a downwardly-increasing diameter. Such a configuration is effective to achieve even diffusion of the process gas passing through the diffusion hole 16a. That is, the process gas, passed through the narrow cylindrical upper portion 16a1 of the diffusion hole 16a, can widely spread out while passing through the conical lower portion 16a2.

Referring again to FIG. 2, the spray plate 14 of the shower head 10 is mounted to seal the open lower surface of the shower head body 12. As can be seen from FIG. 5, the spray plate 14 has a plurality of spray holes 14a, and preferably, hundreds to thousands of the spray holes 14a are provided in the spray plate 14. Conventionally, each of the spray holes has a diameter in a range of 0.1 mm to 1 mm.

Figure 5:
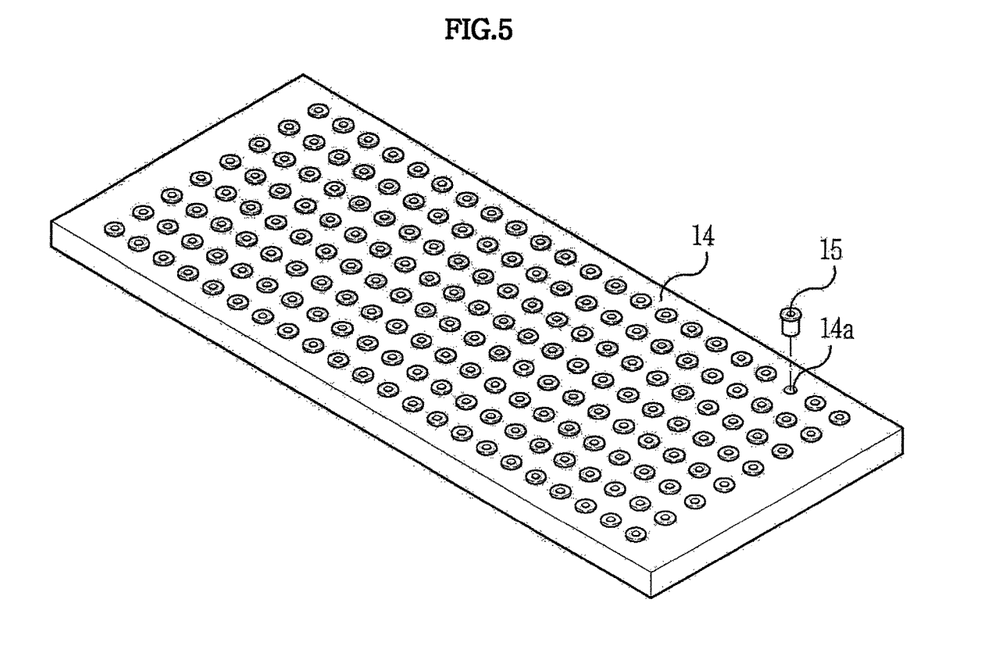
FIG. 5 is a perspective view illustrating the structure of a spray plate included in the shower head in accordance with the present invention.

If the diameter of the spray hole is too small, it complicates the processing of the spray hole and consequently increases the price of the spray plate. This inevitably increases the price of a substrate being produced by the flat panel display manufacturing apparatus. Therefore, in the present embodiment, the spray plate 14 is designed in such a manner that the spray hole 14a has a relatively large diameter in a range of 3 mm to 8 mm, which is equal to approximately ten times the diameter of the conventional spray hole, enabling easy manufacture thereof.

Figure 6:
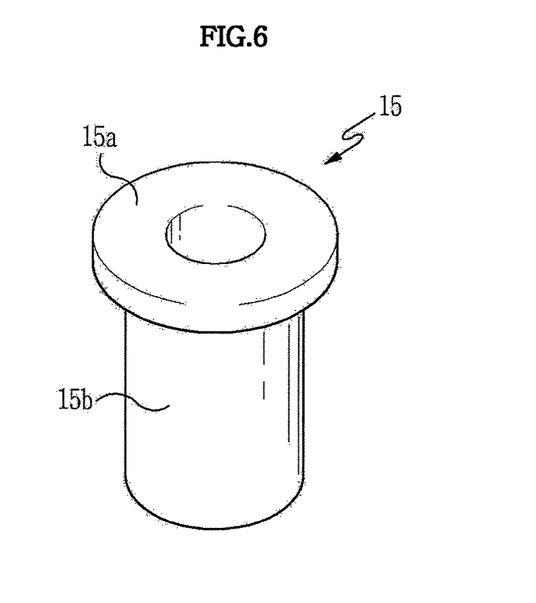
FIG. 6 is a perspective view illustrating the structure of a spray hole plug in accordance with the present invention.
Figure 7:
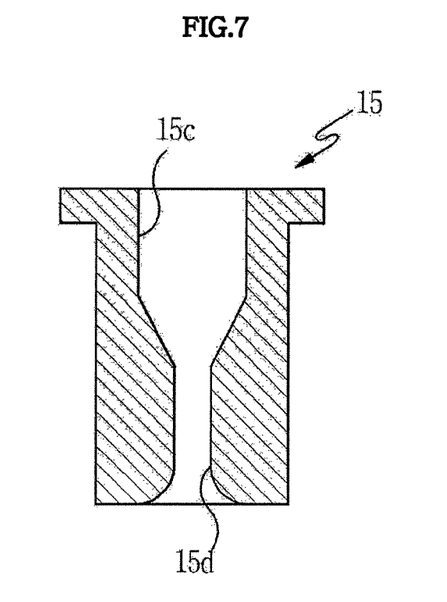
FIG. 7 is a sectional view of the spray hole plug shown in FIG. 6.

However, the above-described large diameter of the spray hole 14a prevents the process gas from being evenly supplied onto a substrate (S) to be processed. In the present embodiment, for the purpose of reducing the diameter of a process gas passage defined in the spray hole 14a to the size of the conventional spray hole, a spray hole plug 15 is inserted in the spray hole 14a. FIG. 6 is a perspective view illustrating the structure of the spray hole plug 15. As shown in FIG. 6, the spray hole plug 15 has an annular holding head 15a, and a cylindrical body 15b having a diameter smaller than an outer diameter of the annular holding head 15a. As can be seen from FIG. 7, the spray hole plug 15 defines a gas passage therein. The gas passage of the spray hole plug 15 takes in the form of a cylinder, and is divided into a relatively wide upper portion 15c, and a relatively narrow lower portion 15d. In this case, preferably, the lower portion 15d of the gas passage has a diameter in a range of 0.1 mm to 1 mm, and is gently rounded at a lower end thereof as shown in FIG. 7. Such a rounding serves to prevent the lower end of the gas passage from being etched by the process gas when the process gas passes through the upper and lower portions 15c and 15d of the gas passage. If the lower end of the spray hole plug 15 is etched by the process gas and generates particles as an etching byproduct, the particles may act as contaminants when a predetermined process is performed.

Preferably, the spray hole plug 15 is made of an electrically insulative material, such as cerazole or ceramic. This is effective to prevent an arcing phenomenon, which is conventionally generated around the spray holes 14a, and thus generates no impurities from the spray plate 14 and minimizes damage to the spray plate 14, thereby lengthening an exchange period of the spray plate 14. Moreover, even if the spray hole plug 15 is damaged, there is no difficulty in exchanging the spray hole plug 15 since the spray hole plug 15 is easily removable from the spray hole 14a.

Referring again to FIG. 2, the spray plate supporting members 18 are mounted in the shower head body 12, so that their lower ends penetrate through the spray plate 14 and their upper ends are attached to the top surface of the shower head body 12. That is, a plurality of the spray plate supporting members 18 are mounted at predetermined central positions of the spray plate 14, and are adapted to prevent warping at the central region of the spray plate 14.

Preferably, the spray plate supporting members 18 are made of an electrically conductive material. This allows the RF current, supplied from the RF current supply device (not shown), to simultaneously reach the overall surface of the shower head 10, used as an upper substrate pedestal. In general, the RF current mainly flows through the shower head body 12 made of the electrically conductive material. This means that the arrival times of the RF current may be differ from each other at the peripheral region and the central region of the spray plate 14, thereby preventing the substrate from being evenly processed. However, in the present embodiment, the RF current is adapted to flow via the spray plate supporting members 18, thereby reaching the peripheral region and the central region of the spray plate 14 at the same time.

In the present embodiment, furthermore, between the upper surface of the shower head body 12 and the top wall surface of the chamber is preferably interposed an insulator member 19, in order to insulate the wall of the chamber with the shower head body 12, since high-voltage current flows through the shower head body 12 upon receiving the RF current.

Embodiment 2

Figure 8:
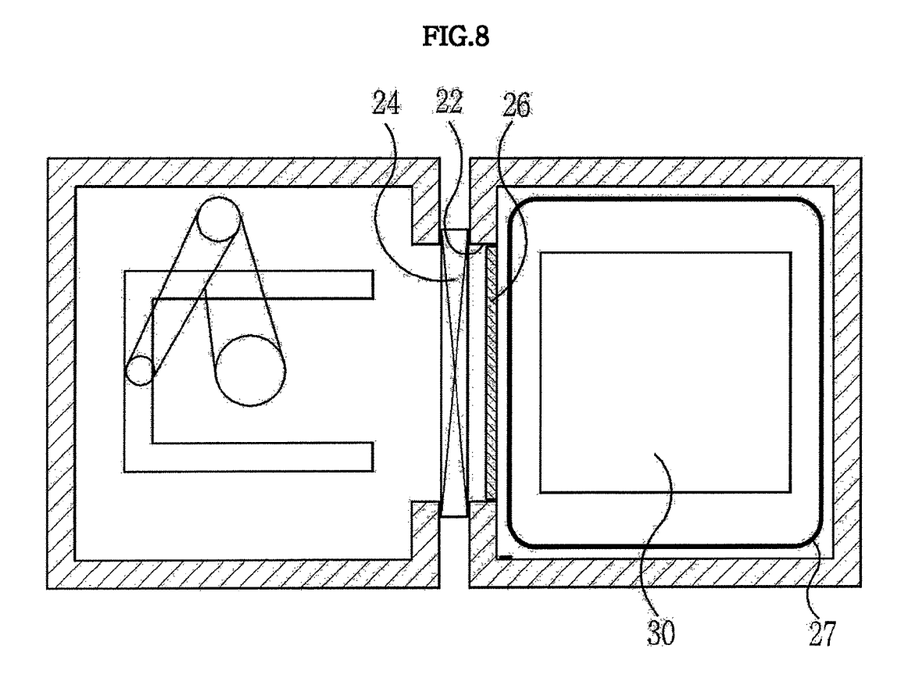
FIG. 8 is a sectional view illustrating the structure of carrier and processing chambers of the flat play display manufacturing apparatus in accordance with the present invention, in the processing chamber being defined imaginary interior space for use in generation of plasma.

FIG. 8 is a sectional view illustrating the structure of the chamber of the flat play display manufacturing apparatus in accordance with the present invention, in the chamber being defined an imaginary interior space for use in the generation of plasma. As shown in FIG. 8, the chamber of the flat panel display manufacturing apparatus is formed at one side wall thereof with a substrate entrance/exit opening 22. The flat panel display manufacturing apparatus of the present invention further comprises a gate valve 24 provided external to the substrate entrance/exit opening 22, and a shutter 26 provided internal to the substrate entrance/exit opening 22.

In this case, preferably, the shutter 26 is positioned so that an inner plane thereof coincides with an imaginary plane extending from an inner wall surface of the chamber. This serves to provide the chamber with a symmetrical interior space defined by a line 27 shown in FIG. 8. The symmetrical interior space of the chamber is a plasma susceptive region used to generate the plasma. That is, the presence of the shutter 26 allows the inner wall surface of the chamber to be continued across the substrate entrance/exit opening 22. In order to achieve even processing on the overall surface of the substrate disposed on the substrate pedestal 30, such a symmetrical plasma susceptive space is essential. Therefore, when a predetermined process is performed in the chamber, the interior of the chamber defines a symmetrical space by means of the shutter 26.

Preferably, the shutter 26 is designed to be opened or closed in a sliding manner. Further, although both the gate valve 24 and the shutter 26, provided external and internal to the substrate entrance/exit opening 22, are separately controllable, preferably, the shutter 26 and the gate valve 24 are controlled to cooperate with each other, so as to be simultaneously opened or closed.

Figure 9:
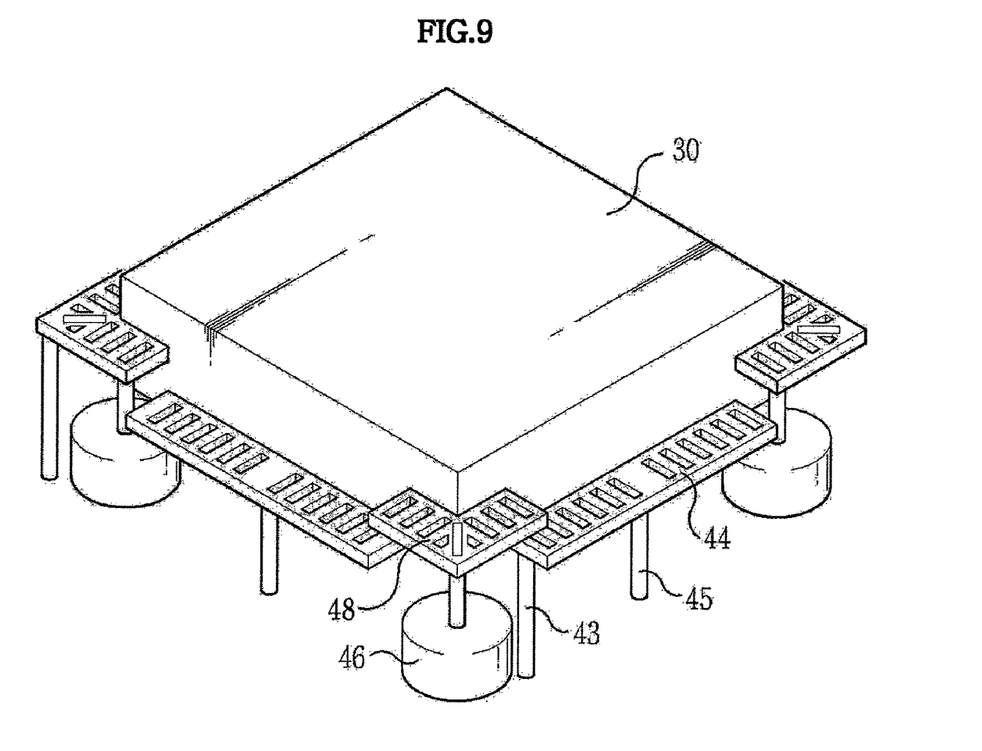
FIG. 9 is a perspective view illustrating the structure of baffles in accordance with the present invention.

FIG. 9 is a perspective view illustrating the structure of a baffle assembly in accordance with the present invention. As shown in FIG. 9, the flat panel display manufacturing apparatus in accordance with the present embodiment comprises a baffle assembly interposed in a space between the substrate pedestal 30 and the inner lateral wall surface of the chamber.

The baffle assembly serves as an exhaust passage for downwardly directing the non-reacted gas and polymer generated in the chamber during processing or after process completion. That is, instead of directly flowing downward through the space between the substrate pedestal 30 and the inner lateral wall surface of the chamber, the process gas and plasma are primarily blocked by the baffle assembly, and then flow downward through slits formed at predetermined positions of the baffle assembly.

In the space between the substrate pedestal 30 and the inner lateral wall surface of the chamber below respective corners of the substrate pedestal 30 are installed exhaust units 46 as shown in FIG. 9. In principle, the process gas flows slowly near the corners of the substrate pedestal 30, and flows fast at the edges of the substrate pedestal 30 within the chamber. This causes corners and edges of the substrate, which is disposed on the substrate pedestal 30, to be unevenly processed, complicating even processing of the substrate. For this reason, it is preferable that corner regions of the baffle assembly are separated from the remaining region, and are spaced apart from the remaining region by a predetermined height.

The baffle assembly of the present embodiment comprises first baffles 48 installed at the corner regions, and second baffles 44 installed at the remaining region, which take a two-step structure.

The first and second baffles 48 and 44, as shown in FIG. 9, have a plurality of slits, respectively. The plurality of slits are spaced apart from one another by predetermined distances for allowing passage of the non-reacted gas, etc. That is, instead of directly flowing toward the exhaust units 46, the flow of the non-reacted gas, etc. is paused momentarily and then is gradually exhausted little by little through the slits.

With the baffles 48 and 44 installed as stated above, the width of the gas passage is narrowed at the edge regions except for the corner regions, resulting in a reduced discharge speed of the process gas. In this way, the flow rates of the process gas at both the corner and edge regions of the substrate pedestal 30 are adjustable to coincide with each other.

Further, as shown in FIG. 9, at predetermined positions below the first and second baffles 48 and 44 are preferably installed driving units 43 and 45 for vertically moving the first and second baffles 48 and 44. That is, the heights of the first and second baffles 48 and 44 are automatically adjustable using the driving units 43 and 45. Therefore, before performing the predetermined process, the first and second baffles 48 and 44 are moved to appropriate positions where the flow rates of the process gas at both the corner and edge regions of the substrate pedestal 30 can coincide with each other in the most effective manner.

Embodiment 3

Figure 10:
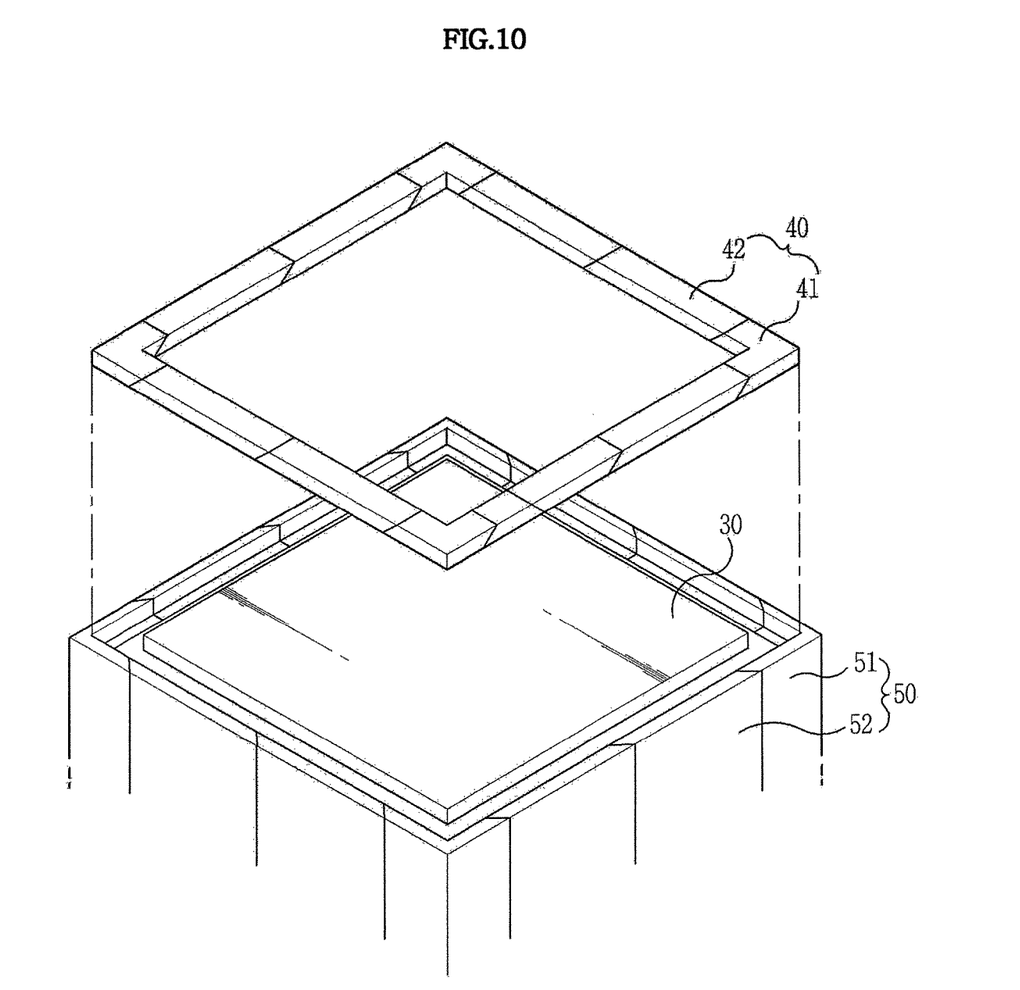
FIG. 10 is an exploded perspective view illustrating the structure of a plasma shielding device in accordance with the present invention.

FIG. 10 is an exploded perspective view illustrating the structure of a plasma shielding device in accordance with the present invention. The plasma shielding device of the flat panel display manufacturing apparatus comprises a horizontal shielding member 40 which consists of a plurality of pieces surrounding the edge of an upper surface of the substrate pedestal 30, and a vertical shielding member 50 which consists of a plurality of pieces surrounding the lateral surface of the substrate pedestal 30 as well as an imaginary surface extending downward from the lateral surface. The horizontal and vertical shielding members 40 and 50 are coupled so that they come into close contact with each other. Such a plasma shielding device is made of a plasma-resistant material, and preferred examples of the plasma-resistant material include ceramic, vespel, or the like.

It should be understood that the plasma shielding device of the present embodiment is commonly applicable to the shower head 10 and the substrate pedestal 30. Preferably, the horizontal shielding member 40, installed around the periphery of the substrate pedestal 30, is positioned higher than the substrate pedestal 30 by a predetermined height considering the thickness of the substrate, disposed on the substrate pedestal 30 to be processed by the plasma. This serves to prevent the lateral surface and rear surface of the substrate located on the substrate pedestal 30 from being attacked by the plasma. In this case, a preferred spacing height between the horizontal shielding member 40 and the substrate pedestal 30 is approximately 2 mm.

Meanwhile, the horizontal shielding member 40 serves to prevent direct attack by the plasma, generated in a space between the substrate pedestal 30 and the shower head 10, toward the upper surface of the substrate pedestal 30. Here, it is difficult to form the horizontal shielding member 40 to have a single unit structure due to the use of large-scale substrates. Therefore, as shown in FIG. 10, the horizontal shielding member 40 is formed by coupling a plurality of first corner pieces 41 and a plurality of first edge pieces 42. The first corner pieces 41 are adapted to surround the corner regions of the substrate pedestal 30, whereas the first edge pieces 42 are adapted to surround four edges of the substrate pedestal 30. In this case, preferably, the respective first corner pieces 41 have an "L"-shaped form, and the respective first edge pieces 42 have an elongated rectangular bar form.

The plurality of first corner and edge pieces 41 and 42 of the horizontal shielding member 40 are coupled to come into close contact with one another. In the following description, preferred embodiments of coupling manners between the first corner piece 41 and the first edge piece 42 or between the first edge pieces 42 will be explained.

Embodiment 3-1

Figure 11:
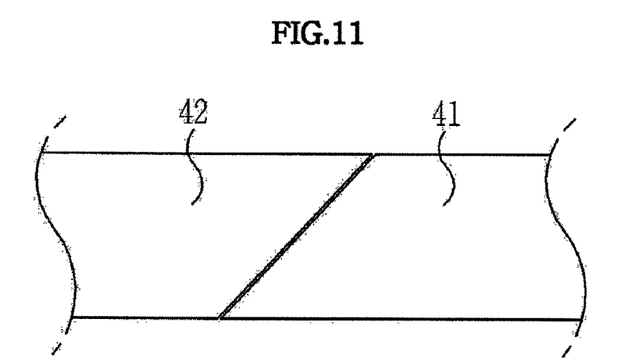
FIG. 11 is a sectional view illustrating the shape of engagement surfaces of respective pieces of a horizontal shielding member in accordance with Embodiment 3-1 of the present invention.

First, as shown in FIG. 11, engagement surfaces between the first corner piece 41 and the first edge piece 42 or between the first edge pieces 42 preferably have complementary inclined-line shaped cross sections, respectively, so as to closely engage with one another. By the nature thereof, the plasma, mainly generated between the shower head 10 and the substrate pedestal 30, progress in a straight direction. Therefore, if the engagement surfaces of the respective pieces extend perpendicular to a horizontal direction, the plasma straightly attacks the substrate pedestal 30 along the perpendicular engagement surfaces, increasing the possibility of damage to the substrate pedestal 30 and any other facilities associated with the substrate pedestal 30. For this reason, in the present embodiment, the engagement surfaces of the respective pieces of the horizontal shielding member 40 are formed to have the inclined-line shaped cross sections suitable to change the progress route of the plasma from the straight direction to an inclined direction, enabling effective shielding of the plasma. The engagement surfaces of the respective pieces of the present embodiment, furthermore, are easy to process, thereby reducing time and costs required to process while enabling effective shielding of the plasma.

Embodiment 3-2

Figure 12:
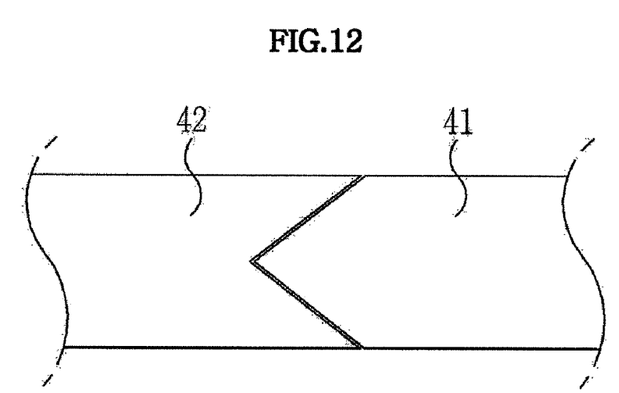
FIG. 12 is a sectional view illustrating the shape of engagement surfaces of respective pieces of a horizontal shielding member in accordance with Embodiment 3-2 of the present invention.

Alternatively, referring to FIG. 12, engagement surfaces between the first corner piece 41 and the first edge piece 42 or between the first edge pieces 42 preferably have complementary "V"-shaped cross sections, respectively, so as to closely engage with one another. Here, the "V"-shaped cross section is obtained by folding the middle point of the inclined-line shaped engagement surface disclosed in Embodiment 3-1 in order to reduce the possibility of passage of the plasma through the engagement surface. In the case of such a "V"- shaped engagement surface, although it requires an increased processing time, it can more surely shield the plasma.

Embodiment 3-3

Figure 13:
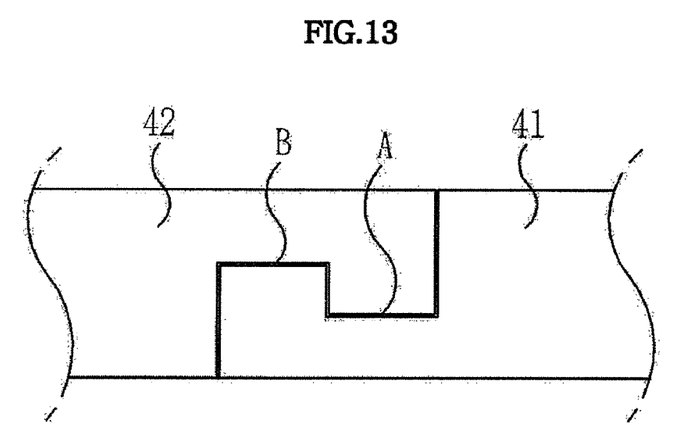
FIG. 13 is a sectional view illustrating the shape of engagement surfaces of respective pieces of a horizontal shielding member in accordance with Embodiment 3-3 of the present invention.

Alternatively, referring to FIG. 13, engagement surfaces between the first corner piece 41 and the first edge piece 42 or between the first edge pieces 42 preferably have complementary toothed line shaped cross sections, respectively, so as to closely engage with one another. In such a toothed line shaped cross section, a protrusion (A) and a recess (B) are formed adjacent to each other. In a state wherein the respective pieces are coupled to one another as shown in FIG. 13, as the engagement surfaces of the respective pieces are symmetrically formed and coupled to one another, the progress route of the plasma are repeatedly refracted, entirely eliminating the possibility of passage of the plasma. Further, through the engagement of the protrusions (A) and the recesses (B), even if tensile forces, caused by an external force applied thereto, act between the engaged respective pieces during long time use of the plasma shielding device inside the flat panel display manufacturing apparatus, it is possible to entirely prevent the engagement surfaces of the respective pieces from being separated from one another.

Embodiment 3-4

Figure 14:
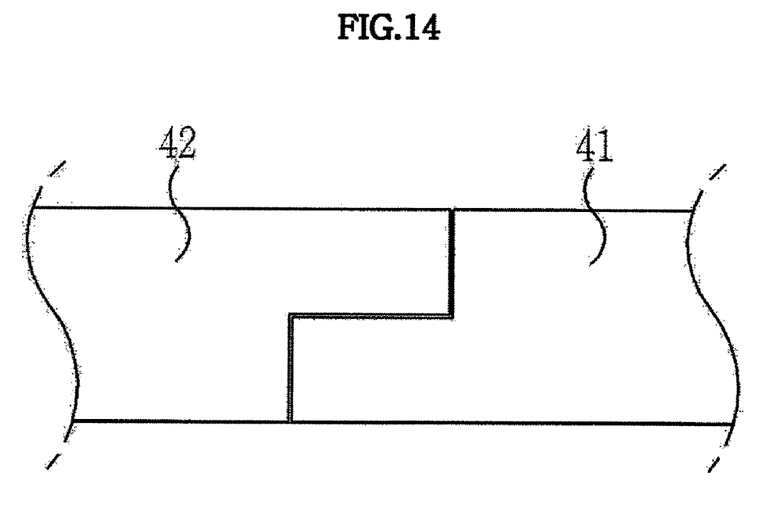
FIG. 14 is a sectional view illustrating the shape of engagement surfaces of respective pieces of a horizontal shielding member in accordance with Embodiment 3-4 of the present invention.

Finally, referring to FIG. 14, engagement surfaces between the first corner piece 41 and the first edge piece 42 or between the first edge pieces 42 preferably have complementary stepped line shaped cross sections, respectively, so as to closely engage with one another. In such a stepped line shaped cross section, the engagement surface is stepped in a thickness direction to have a single step. Such a shape of the engagement surface also serves to refract the progress route of the plasma for shielding the plasma.

Now, considering the configuration and operation of the vertical shielding member 50, it serves to protect the substrate pedestal 30 and other associated facilities from lateral attack by the plasma. Although the majority of the plasma is generated in the space between the shower head 10 and the substrate pedestal 30 and tends to attack the horizontal shielding member 40, part of the plasma may escape out of the space between the shower head 10 and the substrate pedestal 30 and laterally attack the substrate pedestal 30. Therefore, the vertical shielding member 50 serves to shield lateral attack by the plasma to the substrate pedestal 30, thereby protecting the substrate pedestal 30 and other associated facilities installed below the substrate pedestal 30 from the plasma.

Similar to the horizontal shielding member 40, it is difficult to form the vertical shielding member 50 to have a single unit structure. Therefore, as shown in FIG. 10, the vertical shielding member 50 is formed by coupling a plurality of second corner pieces 51 and a plurality of second wall pieces 52 in a close contact state. The second corner pieces 51 are adapted to surround corner regions of the substrate pedestal 30, whereas the second wall pieces 52 are adapted to surround the overall lateral surface of the substrate pedestal 30 as well as the imaginary surface extending downward from the lateral surface. In this case, preferably, the second corner pieces 51 have an "L"-shaped form in the same manner as the first corner pieces 41.

In the same manner as the first corner pieces 41 and the first edge pieces 42, the second corner pieces 51 and the second wall pieces 52 are preferably configured in such a manner that engagement surfaces between the second corner piece 51 and the second wall piece 52 or between the second wall pieces 52 preferably have complementary stepped line shaped cross sections, respectively, so as to closely engage with one another. In such a stepped cross section, the engagement surface is stepped in a thickness direction to have a single step.

Alternatively, the engagement surfaces between the second corner piece 51 and the second wall piece 52 or between the second wall pieces 52 preferably have complementary inclined-line shaped cross sections, respectively, so as to closely engage with one another.

Alternatively, the engagement surfaces between the second corner piece 51 and the second wall piece 52 or between the second wall pieces 52 preferably have complementary "V"-shaped cross sections, respectively, so as to closely engage with one another.

FIG. 2 is a sectional view illustrating the structure of a flat panel display manufacturing apparatus in accordance with the present invention. As shown in FIG. 2, the flat panel display manufacturing apparatus comprises a shower head 10, and in turn, the shower head 10 comprises: a chamber 11, a shower head body 12, a diffusion plate 16, a spray plate 14, and spray plate supporting members 18. Alternatively, the engagement surfaces between the second corner piece 51 and the second wall piece 52 or between the second wall pieces 52 preferably have complementary toothed line shaped cross sections, respectively, so as to closely engage with one another. In such a toothed line shaped cross section, a protrusion (A) and a recess (B) are formed adjacent to each other.

The plasma shielding device of the present invention as stated above is completed by coupling the horizontal shielding member 40 with the vertical shielding member 50 so as to come into close contact with each other. That is, in the case of the horizontal shielding member 40, although it can effectively shield vertical attack by the plasma, it has a disadvantage in that it cannot shield lateral attack by the plasma. Contrary, in the case of the vertical shielding member 50, although it can effectively shield lateral attack by the plasma, it has a disadvantage in that it cannot shield vertical attack by the plasma. Therefore, only in a state wherein an outer circumferential end (C) of the horizontal shielding member 40 and an upper end (D) of the vertical shielding member 50 are coupled to come into close contact with each other, the plasma shielding device can shield attack by the plasma in all directions. In this case, the outer circumferential end (C) of the horizontal shielding member 40 is a circumferential end facing the inner lateral wall surface of the chamber rather than to come into contact with the substrate pedestal 30, and the upper end (D) of the vertical shielding member 50 is a portion in contact with the horizontal shielding member 40.

Now, preferred embodiments in relation to the coupling manners of the vertical and horizontal shielding members 40 and 50 will be explained.

Embodiment 3-5

Figure 15:
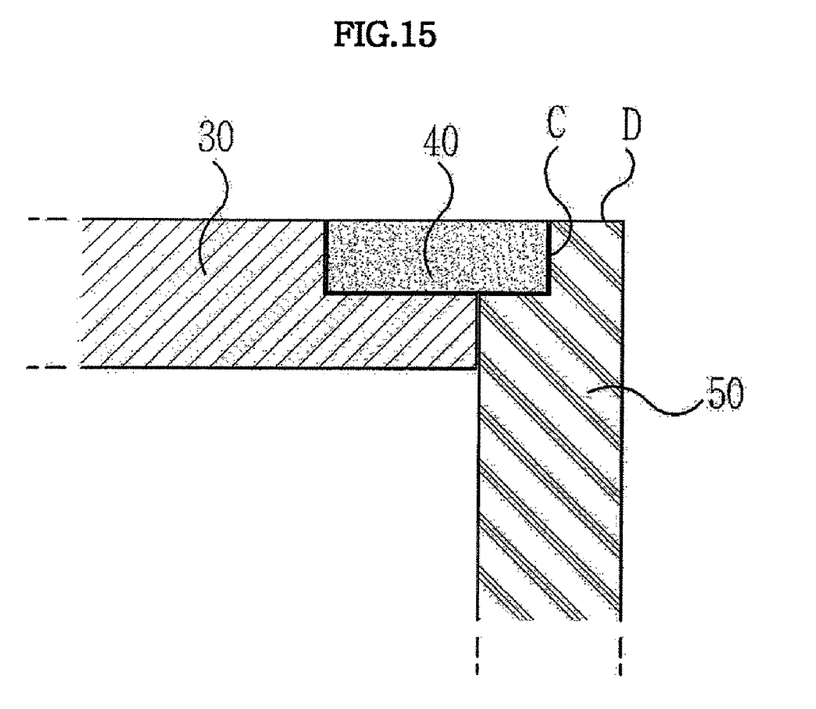
FIG. 15 is a sectional view illustrating the coupling manner of horizontal and vertical shielding members in accordance with Embodiment 3-5 of the present invention.

First, as shown in FIG. 15, the horizontal shielding member 40 is configured so that the outer circumferential end (C) thereof protrudes outward beyond a circumferential end of the substrate pedestal 30 by a predetermined length, and the vertical shielding member 50 is configured so that the upper end (D) thereof is stepped to be closely coupled with both lateral and lower surfaces of the protruded portion of the horizontal shielding member 40. With such a configuration, the outer circumferential end (C) of the horizontal shielding member 40 and the upper end (D) of the vertical shielding member 50 can be coupled to come into close contact with each other. When the horizontal and vertical shielding members 40 and 50 are coupled to each other according to the present embodiment, attack by the plasma in a lateral direction of the horizontal shielding member 40 can be shield by the upper end (D) of the vertical shielding member 50, and attack by the plasma in a vertical direction of the vertical shielding member 50 can be shield by the outer circumferential end (C) of the horizontal shielding member 40, resulting in total plasma shielding in all directions.

Embodiment 3-6

Figure 16:
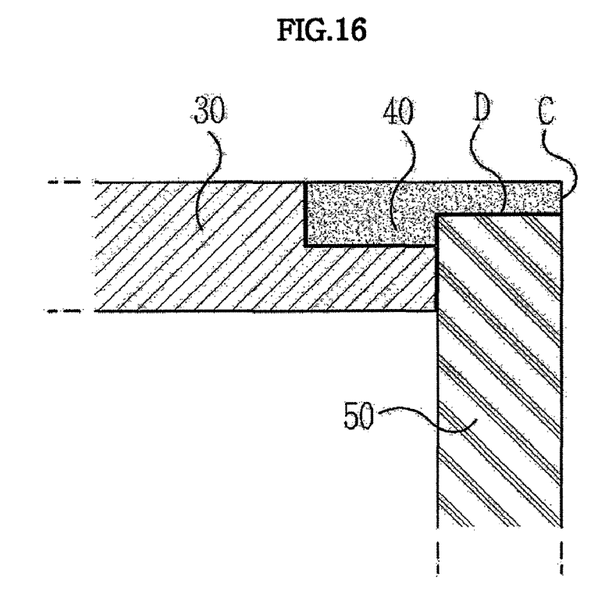
FIG. 16 is a sectional view illustrating the coupling manner of horizontal and vertical shielding members in accordance with Embodiment 3-6 of the present invention.

Alternatively, as shown in FIG. 16, the vertical shielding member 50 is configured so that the upper end (D) thereof protrudes upward beyond a horizontal plane of a stepped region of the substrate pedestal 30 by a predetermined height, and the horizontal shielding member 40 is configured so that the outer circumferential end (C) thereof is stepped to be closely coupled with both lateral and upper surfaces of the protruded portion of the vertical shielding member 50. With such a configuration, the outer circumferential end (C) of the horizontal shielding member 40 and the upper end (D) of the vertical shielding member 50 can be preferably coupled to come into close contact with each other. Even in this case, similar to the above Embodiment (3-5), the horizontal and vertical shielding members 40 and 50 can complement each other, enabling total plasma shielding in all directions.

Embodiment 3-7

Figure 17:
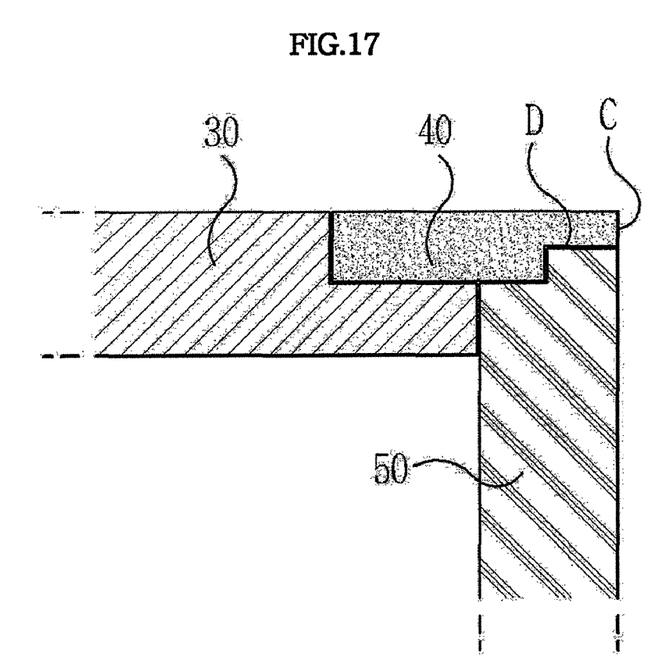
FIG. 17 is a sectional view illustrating the coupling manner of horizontal and vertical shielding members in accordance with Embodiment 3-7 of the present invention.

Alternatively, as shown in FIG. 17, the vertical shielding member 50 is configured so that the upper end (D) thereof protrudes beyond the horizontal plane of the stepped region of the substrate pedestal 30 by the same height as the thickness of the horizontal shielding member 40 and a predetermined part of the protruded portion is stepped. In this case, the horizontal shielding member 40 is configured so that it can be inserted in the stepped region of the substrate pedestal 30 and the outer circumferential end (C) thereof is stepped so as to be closely coupled with the stepped portion of the vertical shielding member 50. With such a configuration, the outer circumferential end (C) of the horizontal shielding member 40 and the upper end (D) of the vertical shielding member 50 can be preferably coupled to come into close contact with each other. The present embodiment allows the progress route of the plasma to be repeatedly refracted, entirely eliminating the possibility of attack by the plasma and resulting in enhanced plasma shielding efficiency.

Embodiment 3-8

Figure 18:
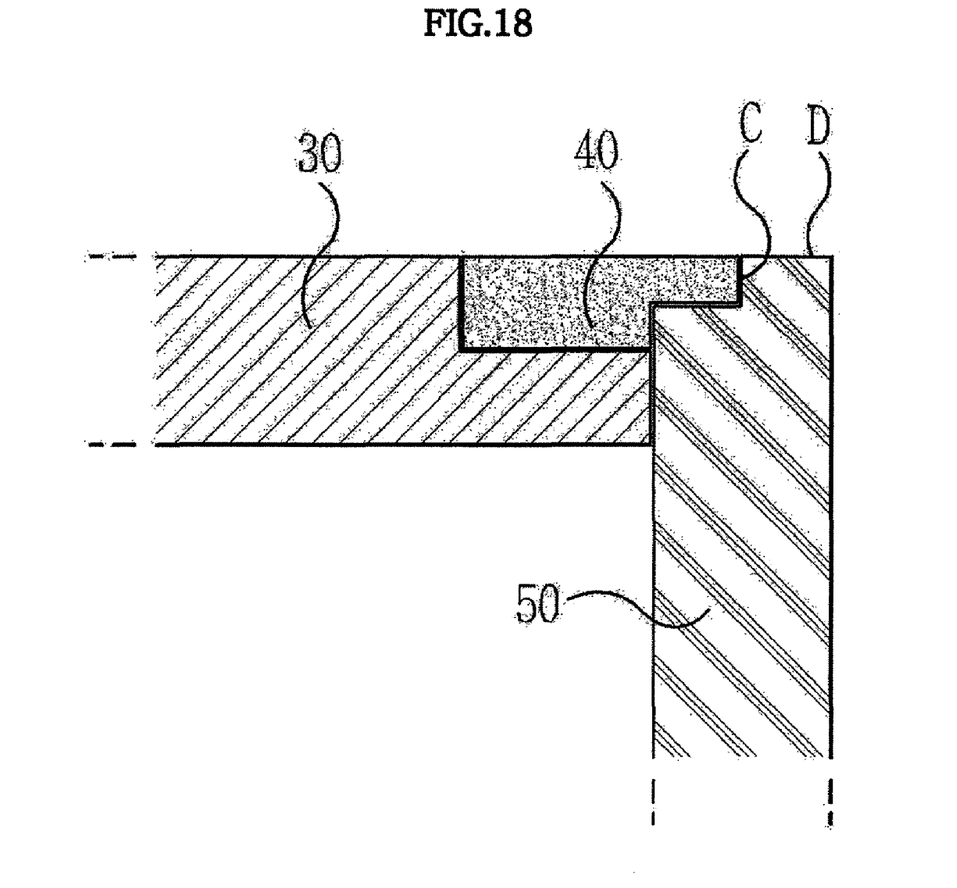
FIG. 18 is a sectional view illustrating the coupling manner of horizontal and vertical shielding members in accordance with Embodiment 3-8 of the present invention

Finally, as shown in FIG. 18, the horizontal shielding member 40 is configured so that the outer circumferential end (C) thereof protrudes outward from the circumferential end of the stepped region of the substrate pedestal 30 by a predetermined length, and a predetermined part of the protruded portion is stepped by a predetermined thickness, and the vertical shielding member 50 is configured so that the it is coupled to the lateral surface of the substrate pedestal 30 and the upper end (D) thereof is stepped so as to be coupled with the stepped portion formed at the outer circumferential end (C) of the horizontal shielding member 40. With such a configuration, the outer circumferential end (C) of the horizontal shielding member 40 and the upper end (D) of the vertical shielding member 50 can be preferably coupled to come into close contact with each other. The present embodiment also repeatedly refracts the progress route of the plasma, improving shielding efficiency of the plasma.

Among the above described preferred embodiments related to the coupling manners of the horizontal and vertical shielding members 40 and 50, specifically, in the case of Embodiments (3-6 and 3-8), the progress route of the plasma defined in the coupling surfaces of the horizontal and vertical shielding members 40 and 50 extend in a lateral direction, rather than to extend toward the space between the shower head 10 and the substrate pedestal 30, in which the majority of the plasma is generated. This has the effect of reducing the possibility of attack by the plasma as compared to Embodiments (3-5 and 3-7). Thus, it can be said that Embodiments (3-6 and 3-8) are preferred over Embodiments (3-5 and 3-7).

As apparent from the above description, the present invention provides a flat panel display manufacturing apparatus having a shower head, which has a simplified structure wherein a single diffusion plate is employed, and thus is easy to manufacture.

The shower head of the flat panel display manufacturing apparatus further comprises a spray plate which is easy to manufacture and can eliminate the occurrence of an arcing phenomenon caused by plasma, thereby solving any problems due to frequent exchange and difficulties in manufacture of the spray plate.

According to the present invention, also, at the center of the spray plate is mounted spray plate supporting members, so as to prevent warping at the center of the spray plate and to conduct even distribution of the plasma.

In the flat panel display manufacturing apparatus of the present invention, inside a processing chamber thereof is defined a perfect symmetrical space when a predetermined process is performed on a substrate disposed on a substrate pedestal mounted in the chamber, enabling even processing on the overall surface of the substrate.

Furthermore, the flat panel display manufacturing apparatus of the present invention comprises a stepped baffle assembly wherein baffles associated with exhaust units are positioned at a different level from the other baffles. Such a stepped baffle assembly can equalize flow rate of a process gas throughout the interior of the processing chamber, enabling even processing of the substrate.

The heights of the baffles are automatically adjustable with the result that the baffles can be positioned to achieve the constant flow rate of the process gas inside the processing chamber.

The flat panel display manufacturing apparatus according to the present invention further comprises a plasma shielding device. The plasma shielding device is formed by assembling a plurality of pieces, enabling processing of the latest large-scale substrates.

In the plasma shielding device of the present invention, the plurality of pieces have engagement surfaces which are easy to process, thereby being capable of reducing time and costs required to process the plasma shielding device.

Such a plasma shielding device comprises a horizontal shielding member and a vertical shielding member, which are closely coupled to each other. Consequently, the plasma shielding device is easy to process and can shield total plasma in all directions.

Moreover, since the plasma shielding device is formed using the plurality of pieces, the plasma shielding device is free from damage due to a difference in thermal expansion rates between the plasma shielding device and the substrate pedestal. In general, the substrate pedestal is made of aluminum having a high thermal expansion coefficient, whereas the plasma shielding device is made of ceramic showing substantially no thermal expansion. Therefore, if the plasma shielding device and the substrate pedestal are repeatedly processed at high and low temperatures using the plasma in a state wherein the plasma shielding device is closely coupled around the substrate pedestal, there exists the possibility of damaging the plasma shielding device due to the different thermal expansion rates. However, such a problem can be completely solved according to the present invention since the plurality of pieces of the plasma shielding device can be spaced apart from one another to some extent.

In the plasma shielding device of the present invention, furthermore, even if any one of the pieces is damaged, it can be easily repaired through simple exchange of the damaged piece.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A flat panel display manufacturing apparatus comprising: a chamber;
   a substrate pedestal located in the chamber, a substrate being disposed on the substrate pedestal so that a predetermined process is performed on the substrate using plasma, and the substrate pedestal having a rectangular shape; and
   a baffle means interposed in a space formed between the substrate pedestal and a lateral wall of the chamber such that the plasma flowing to the space is exhausted through the baffle means,
   the baffle means comprising:
   first baffles proximal to a perimeter of a corner of the substrate pedestal; and
   second baffles between the first baffles, wherein the first and second baffles are vertically adjustable with respect to each other so that a width of a gas passage between the first baffles and the second baffles is variable and;
   an exhaust unit provided below each of the first baffles at the corner region and no exhaust unit provided below any of the second baffles at the edge regions.

2. The flat panel display manufacturing apparatus as set forth in claim 1, wherein the second baffles are positioned at a lower height than the first baffles.

3. The apparatus as set forth in claim 1, further comprising a first and a second driving unit vertically moving the first and second baffles, respectively.

* * * * *